United States Patent
Jarrar et al.

(10) Patent No.: US 8,604,853 B1
(45) Date of Patent: Dec. 10, 2013

(54) STATE RETENTION SUPPLY VOLTAGE DISTRIBUTION USING CLOCK NETWORK SHIELDING

(75) Inventors: Anis M. Jarrar, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/480,971

(22) Filed: May 25, 2012

(51) Int. Cl.
*H03K 3/289* (2006.01)

(52) U.S. Cl.
USPC .......................................... 327/202

(58) Field of Classification Search
USPC .................. 327/199–203, 205–219, 224, 225
See application file for complete search history.

(56) References Cited

U.S. PATENT DOCUMENTS

| | | | |
|---|---|---|---|
| 6,930,522 B2 * | 8/2005 | Chang | 327/154 |
| 7,164,301 B2 | 1/2007 | Chun | |
| 7,683,697 B2 | 3/2010 | Berzins et al. | |
| 7,768,331 B1 | 8/2010 | Biyani | |
| 2011/0302540 A1 * | 12/2011 | Kwon et al. | 716/100 |

\* cited by examiner

*Primary Examiner* — Lincoln Donovan
*Assistant Examiner* — Sibin Chen
(74) *Attorney, Agent, or Firm* — Gary Stanford

(57) ABSTRACT

An integrated circuit including a state retention node, a conductive clock network shielding and multiple state retention devices for maintaining a state of the integrated circuit during the low power state. The state retention node receives a state retention supply voltage which remains at an operative voltage level during a low power state. The conductive clock network shielding is distributed with clock signal conductors and is coupled to the state retention node. Each state retention device has a supply voltage input coupled to the clock network shielding so that it remains powered during the low power state. The state retention node may be implemented as a minimal set of conductive traces. A state retention buffer may be provided for buffering a power gating signal indicative of the low power state, in which the buffer has a supply voltage input coupled to the clock network shielding.

20 Claims, 3 Drawing Sheets

STATE RETENTION SUPPLY VOLTAGE DISTRIBUTION USING CLOCK NETWORK SHIELDING

BACKGROUND OF THE INVENTION

1. Field of the Invention

The present invention relates generally to state retention of an integrated circuit, and more particularly to leveraging a clock network shielding to distribute a state retention supply voltage to state retention devices on the integrated circuit.

2. Description of the Related Art

Low Power consumption is emerging as a very important feature for many handheld and battery powered applications. In conventional configurations, however, low power design was not free and added considerable overhead in both silicon area and routing. In particular, an application may be configured with one or more low power states in which only a subset of the components remain powered on to maintain the state of the device. The state retention devices are typically distributed throughout the chip or integrated circuit (IC). In the conventional configuration, a state retention supply voltage was distributed to the state retention devices using a separate state retention power grid. The state retention power grid consumed significant routing resources and reduced the available space for functional components. Further, the state retention power grid often required additional metal layers complicating design and substantially increasing cost.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

A state retention supply distribution system using clock network shielding according to exemplary embodiments reduces routing overhead. The system is applicable to many low power techniques including the State Retention Power Gating (SRPG) low power technique. In many high speed designs, including system on chip (SOC) designs, same layer coupling capacitances are larger and the clock networks are typically double spaced and shielded to maintain clock signal integrity. In conventional configurations, the clock network shielding was grounded or otherwise coupled to a VSS power supply. VSS is at a reference voltage level, which is any positive, negative or ground voltage level. A separate state retention grid was provided on the integrated circuit (IC) or chip and coupled to state retention devices on the chip. The state retention grid was coupled to a state retention voltage level. In the low power state, most of the devices of the chip were powered down whereas the state retention devices remained powered by the state retention voltage level. The separate state retention grid, however, consumed valuable space on the IC.

In embodiments described herein, the clock network shielding is coupled to the state retention power supply node rather than VSS. A minimal set of conductive traces is provided to couple the state retention node to the existing clock network shielding, which is already distributed near the state retention devices. The state retention devices are coupled to the clock network shielding. In this manner, the clock network shielding is leveraged to distribute the state retention voltage to the state retention devices rather than a separate, space consuming power grid.

In one embodiment, VDDC does not carry much current since it only supports a reduced number of state retention devices and some power gating buffers. In one embodiment, VDDC does not drive clock buffers. In one embodiment, the state retention devices may include the slave portion of SRPG flops.

Figure 1:
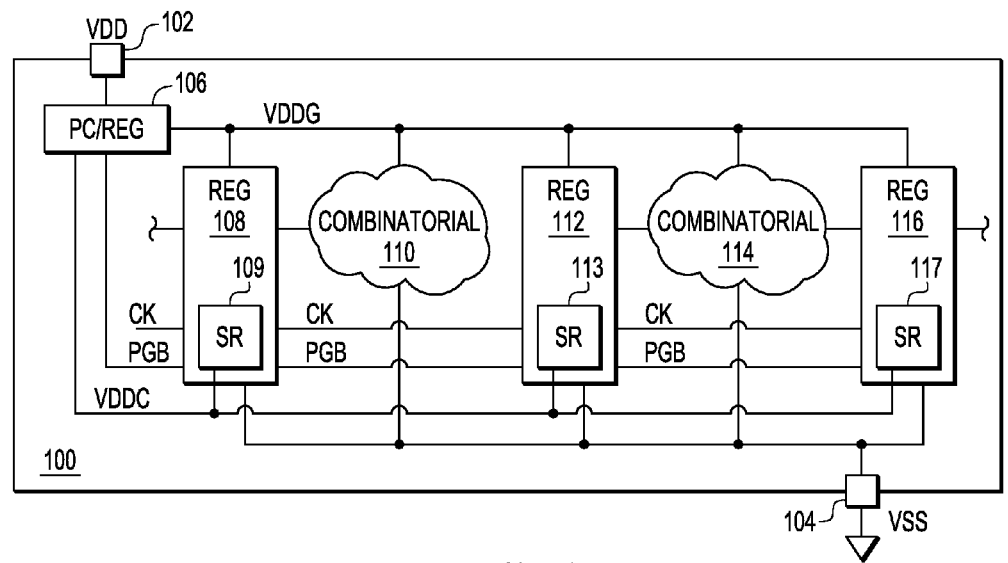
FIG. 1 is a simplified block diagram of an integrated circuit incorporating a state retention supply distribution using clock network shielding according to one embodiment.

FIG. 1 is a simplified block diagram of an integrated circuit (IC) 100 incorporating a state retention supply distribution using clock network shielding according to one embodiment. The IC 100 includes power supply pins VDD 102 and VSS 104. The VDD pin 102 is coupled to a power control circuit 106, which distributes a switched or gated power supply voltage VDDG to register logic and combinatorial logic distributed across the IC 100, and which also provides a non-gated or constant state retention power supply voltage VDDC to state retention (SR) devices as further described herein. The power control circuit 106 may include regulator circuitry for regulating power supply voltages. The power control circuit 106 provides a power gating signal PGB for switching between normal and a power reduced or low power state as further described herein. The register logic may be distributed in multiple sections or levels, shown figuratively as registers 108, 112 and 116. The combinatorial logic is distributed between the register logic, including combinatorial logic 110 between registers 108 and 112 and combinatorial logic 114 between registers 112 and 116. VDDG and VSS are shown distributed to the register logic and the combinatorial logic for providing power during normal operation. A clock signal CK and the power gating signal PGB are shown distributed to the registers 108, 112 and 116.

A subset of the register logic is configured with state retention devices. As shown, for example, registers 108, 112 and 116 include state retention (SR) portions 109, 113 and 117, respectively. The power control circuit 106 initiates the low power state by asserting the PGB signal, and then the power control circuit 106 reduces voltage and/or power level of VDDG to power-down most of the register logic and substantially all of the combinatorial logic to conserve power. The state retention supply voltage VDDC, however, is distributed to the SR portions 109, 113 and 117 so that the state retention devices remain powered during the low power states. The lower power state reduces power by a substantial factor. In one embodiment, for example, the lower power state reduces power by a factor of 10-20, although the specific power reduction factor depends on the particular implementation.

The SR portions 109, 113 and 117 are strategically selected to maintain the state of the IC 100 so that operations may be resumed once the power state is returned to the normal operating state. Each SR portion 109, 113 and 117 includes, for example, one or more state retention devices powered by VDDC so that each state retention device maintains its logic state during the low power state. To resume normal operations, VDDG is re-energized to full power level and then the PGB signal is de-asserted. In one embodiment, PGB is asserted low for the low power state and de-asserted high during the normal operating state.

The VDDC voltage is distributed to the SR portions 109, 113 and 117 via a network 118. Rather than a separate state retention network as in conventional configurations, the clock network shielding distributed with the CK signal is used as the network 118 to distribute VDDC to the state retention devices as further described herein.

Figure 2:
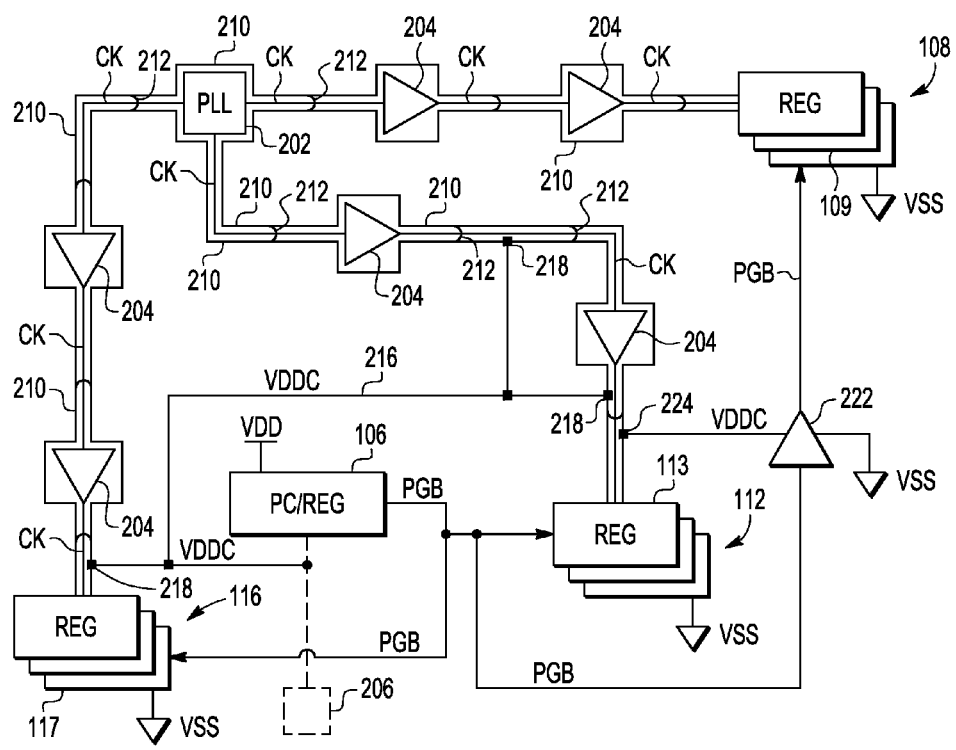
FIG. 2 is a schematic and block diagram providing further details of the state retention supply distribution using clock network shielding configuration of the IC of FIG. 1.

FIG. 2 is a schematic and block diagram providing further details of the state retention supply distribution using clock network shielding configuration of the IC 100. A phase locked loop (PLL) 202 generates a clock signal CK which is distributed across the IC 100. As shown, the PLL 202 provides the clock signal CK along multiple clock branches in which it is understood that the implementation is not limited to any particular number of clock branches. In the illustrated configuration, a first clock signal branch provides CK to registers 108 (including the state retention portion 109), a second to registers 112 (including the state retention portion 113) and a third to registers 116 (including the state retention portion 117) as shown. Each clock signal branch carries a clock signal CK, in which branch CK may have the same frequency or may have a different frequency depending upon the particular implementation.

Clock buffers 204 are distributed along the clock branches carrying the clock signal CK to the various destinations of the IC 100, and the branches of conductive traces carrying the clock signal CK are surrounded by clock network shielding 210 to maintain clock signal integrity. The clock network shielding 210 is routed adjacent on both sides of each clock trace separated by a predetermined distance. The clock network shielding 210 may, in some cases, also be provided above and/or below a clock trace, such as provided on different layers of the IC 100. Conductive links 212 are shown distributed along the clock network shielding 210 to represent that the shielding on either side (and above and below, if provided) are electrically coupled together so that the clock network shielding 210 forms a single electrical node. The clock signal conductive branches, the clock buffers 204 and the clock network shielding 210 collectively form the clock network for providing one or more clock signals to the register logic of the IC 100.

The structure of the clock network shielding 210 may have other configurations in other embodiments. In one embodiment, the conductive clock signal traces are routed through interconnect layers of an integrated circuit, and the traces of the clock network shielding 210 are located on both sides of the clock signal trace and/or above and below the clock signal trace on surrounding metal layers. The clock signal traces may also extend through conductive vias located between the layers. The clock signal traces may be surrounded by conductive traces and vias of the clock network shielding 210.

The power control circuit 106 is shown providing the VDDC signal to a state retention node formed by one or more state retention conductive traces. In the illustrated embodiment, VDDC is provided from a source provided on the IC 100, such as being powered directly by the VDD pin. In an alternative embodiment, a separate pin 206 (shown using dashed lines) on the IC 100 is coupled to the state retention node 216 for receiving a VDDC signal which is sourced off-chip. Thus VDDC is sourced on-chip or off-chip. A separate VDDC pin may provide additional system design flexibility at the possible expense of an additional IC pin.

The conductive traces of the state retention node 216 are electrically coupled to the clock network shielding 210 at one or more locations 218. The state retention node 216 charges the clock network shielding 210 to VDDC. In one embodiment, the state retention node 216 includes a minimal number of conductive traces for establishing the clock network shielding 210 at the VDDC voltage level within a predetermined voltage tolerance level. Thus, the conventional state retention power grid is effectively eliminated, and instead the clock network shielding 210 is used to distribute VDDC to the desired locations. The minimal set of conductive traces of the state retention node 216 are provided to electrically couple VDDC to the clock network shielding 210 and to maintain VDDC within an acceptable voltage tolerance range.

The power gating signal PGB is routed to the register logic. A state retention buffer 222 is provided to maintain PGB signal integrity when PGB signal might otherwise be compromised. The state retention buffer 222 includes supply voltage inputs coupled to VSS and to VDDC. As shown, the negative supply voltage input is coupled to VSS and a connection 224 couples the positive supply voltage input of the buffer 222 to the clock network shielding 210 carrying the VDDC power signal. Although only one state retention buffer 222 is shown, and number of the buffers 222 may be provided in any one or more of the conductive traces carrying the PGB signal to the register logic. Each state retention buffer 222 is powered by VDDC via the clock network shielding 210.

Figure 3:
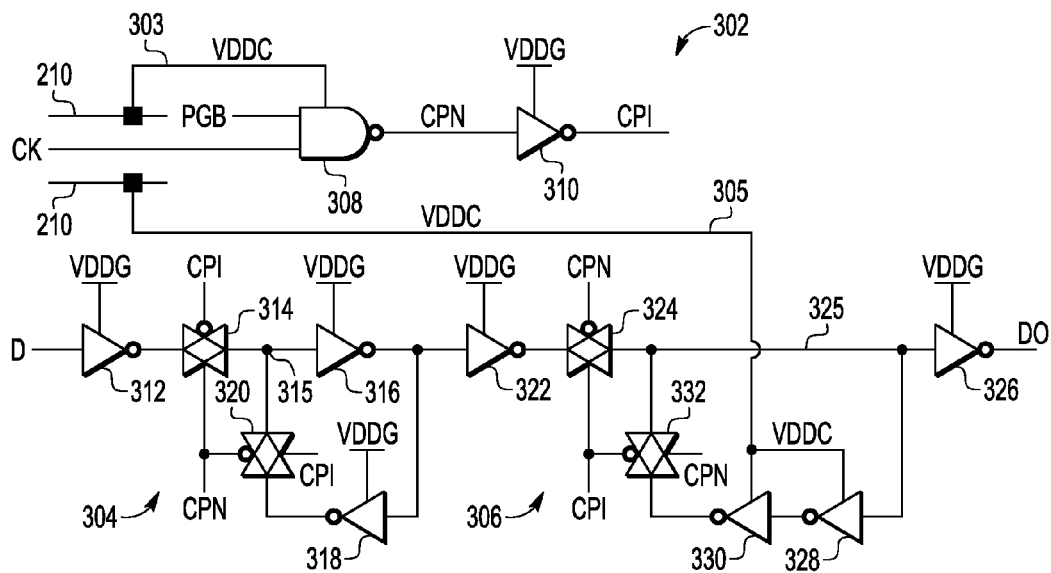
FIG. 3 is a schematic diagram of an exemplary state retention power gating flop which may be used within the register logic of FIG. 1 according to one embodiment.

FIG. 3 is a schematic diagram of an exemplary state retention power gating (SRPG) flop 300 which may be used within the register logic (e.g., registers 108, 112, 116) according to one embodiment. The flop 300 is configured as a master/slave latch (or "flip-flop") in which the slave portion includes state retention devices as part of the SR portion (e.g., 109, 113, 117) of the register logic of the IC 100. The flop 300 includes a control circuit 302, a master latch 304 and a slave latch 306. The control circuit 302 includes a NAND gate 308 and an inverter 310. The NAND gate 308 includes two inputs receiving the PGB and CK signals and has an output providing a first control signal CPN. The inverter 310 has an input receiving CPN and an output providing an inverted control signal CPI. The NAND gate 308 is configured as state retention device powered by VDDC, and the inverter 310 is powered by the gated power supply VDDG.

The master latch 304 includes inverters 312, 316 and 318 and pass gates 314 and 320. A data input signal D is provided to the input of inverter 312, having its output coupled to the input of the pass gate 314. The output of the pass gate 314 is coupled to the input of inverter 316 at a node 315, and the output of inverter 316 is coupled to the input of inverter 318. The output of the inverter 318 is coupled to the input of the pass gate 320, having its output coupled to node 315. The inverters 312, 316 and 318 are powered by gated supply voltage VDDG.

The slave latch 306 includes inverters 322, 326, 328 and 330 and pass gates 324 and 332. The output of inverter 316 is coupled to the input of inverter 322, having its output coupled to the input of pass gate 324. The output of the pass gate 324 is coupled to the inputs of inverters 326 and 328 at a node 325. The output of the inverter 328 is coupled to the input of inverter 330, having its output coupled to the input of pass gate 332. The output of the pass gate 332 is coupled to node 325. The output of the inverter 326 asserts a data output signal DO, which is a latched version of the input data signal D. The inverters 322 and 326 are powered by gated supply voltage VDDG, and the inverters 328 and 330 are powered by the state retention voltage VDDC.

Each pass gate has an inverting control input (indicated by an input bubble) and a non-inverting input. In one embodiment, each pass gate may be implemented as a P-type metal-oxide semiconductor (PMOS) transistor (not shown) coupled in a back-to-back configuration to an N-type MOS (NMOS) transistor (not shown), such as having their drains coupled together and their sources coupled together. The gate of the PMOS transistor forms the inverting input and the gate of the NMOS transistor forms the non-inverting input. CPI is provided to the inverting inputs of the pass gates 314 and 332 and to the non-inverting inputs of the pass gates 320 and 324. CPN is provided to the inverting inputs of the pass gates 320 and 324 and to the non-inverting inputs of the pass gates 314 and 332.

The transistors and other devices (e.g., the devices forming the NAND gate 308 and the inverters 310, 312, etc.) are generally formed on a substrate of the IC 100, whereas the signals routed between the devices (e.g., CK, PGB, CPN, CPI, etc.) are formed by conductive traces routed on interconnect layers or the like and/or along the substrate. The CK signal is routed along a separate clock layer and then routed by conductive interconnects or vias or the like to an input of the NAND gate 308. The clock network shielding 210 is shown routed with CK, in which the clock network shielding 210 is normally terminated and not routed or otherwise provided to the devices on the substrate. As previously described, the clock network shielding 210 of the IC 100 carries the state retention voltage VDDC. A connection 303 is coupled to the clock network shielding 210 and routed to provide VDDC to the positive supply input of the NAND gate 308. Similarly, another connection 305 (or multiple connections) is coupled to the clock network shielding 210 and routed to provide VDDC to the positive supply inputs of the inverters 328 and 330. Although not shown, each of the gates and inverters include similar negative supply inputs coupled to VSS. In this manner, the NAND gate 308 and the inverters 328 and 330 are state retention devices which remain powered by VDDC during the low power state of the IC 100.

During normal operation, PGB is de-asserted high so that CPN toggles to the opposite state of CK and CPI toggles to the opposite state of CPN (and thus to the same state as CK after any delay through NAND gate 308 and inverter 310). When CK is low, the pass gate 314 is turned on, the pass gates 324 and 320 are turned off, input data signal D is inverted by inverter 312 and passed to the input of inverter 316 at node 315, and the inverters 316 and 322 provide an inverted version of D to the input of the pass gate 324. Since the pass gate 324 is off when CK is low, the output of the master latch 304 is isolated from the input of the slave latch 306.

When CK goes high, pass gate 314 is turned off while pass gate 320 is turned on. The input data signal D is isolated from the input of the master latch 304 and the latched state of D is held at the output of the inverter 316 while CK is high. The feedback inverter 318 operates as a keeper with inverter 316 to hold the latched state of D within the master latch 304 while CK is high.

Meanwhile, when CK goes high, the pass gate 324 is turned on to pass the latched and inverted version of D at the output of inverter 322 to the input of the inverter 326 of the slave latch 306, which asserts a latched version of D as the output signal DO. When CK next goes low, the pass gate 324 is turned off to isolate the slave latch 306 from the master latch 304, and the pass gate 332 is turned on. While CK is low, the feedback inverters 328 and 330 operate as a keeper to hold the latched and inverted state of D on node 325 within the slave latch 306. Also, while CK is low, the master latch 304 receives the new state of input data signal D for the next cycle.

When PGB is asserted low to initiate the low power state, CPN is asserted high by the NAND gate 308. CK is thus isolated from the circuit, although the PLL 202 may also be placed into a low power state so that CK is not asserted or otherwise does not transition during the low power state. After PGB is asserted low, the power control circuit 106 disables VDDG or otherwise pulls it low. The inverter 310 is effectively disabled since powered by VDDG, so that CPI is indeterminate or otherwise pulled low. The master latch 304 is effectively shut down since VDDG does not provide power during the low power state. The pass gate 324 is turned off to isolate the slave latch 306 from the master latch 304. The pass gate 332, however, is turned on so that the state of the slave latch 306 is maintained on node 325 by the state retention inverters 328 and 330 during the low power state.

It is appreciated that the slave latch 306 is a state retention device since it has at least two states including logic "0" state when node 325 is pulled low to VSS and a logic "1" state when node 325 is pulled high to VDD (either VDDC or VDDG). The state of node 325, which reflects the last state of the flop 300 prior to the low power state, is held by the inverters 328 and 330 during the low power state. Most of the remaining devices of the flop 300 are powered down since the VDDG is gated off, so that the flop would otherwise lose its state during the low power state.

In order to transition back to the normal state from the low power state, the power control circuit 106 re-enables VDDG while PGB remains asserted low. Also, the PLL 202 begins transitioning CK. Once VDDG stabilizes, the inverter 310 and the gated devices of the flop 300 are powered up. PGB is initially held low until the circuit stabilizes so that the state of the flop 300, held by the slave latch 306, is maintained during transition to the normal power state. When the circuit is stabilized, the control circuit 106 de-asserts PGB high to resume normal operation.

Figure 4:
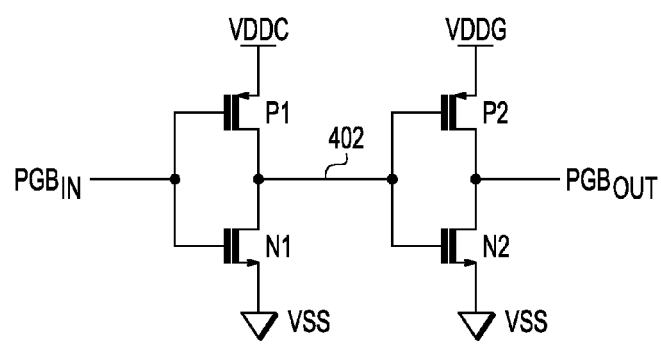
FIG. 4 is a schematic diagram of the state retention buffer of FIG. 2 according to one embodiment.

FIG. 4 is a schematic diagram of the state retention buffer 222 according to one embodiment. The illustrated state retention buffer 222 generally includes a pair of inverters coupled in series in which the first is powered by the state retention voltage VDDC and in which the second is powered by the gated voltage VDDG. The first inverter includes a PMOS transistor P1 having its source coupled to VDDC, its gate coupled to an input node receiving an input signal $PGB_{IN}$, and its drain coupled to an intermediate node 402. The first inverter further includes an NMOS transistor N1 having its drain coupled to node 402, its gate coupled to the input node receiving $PGB_{IN}$, and its source coupled to VSS. The second inverter includes a PMOS transistor P2 having its source coupled to VDDG, its gate coupled to intermediate node 402, and its drain coupled to an output node providing an output signal $PGB_{OUT}$. The second inverter further includes an NMOS transistor N2 having its drain coupled to the output node, its gate coupled to intermediate node 402, and its source coupled to VSS.

In operation, $PGB_{IN}$ is the PGB signal from the control circuit 106 or is a buffered version thereof, and $PGB_{OUT}$ is a buffered version of $PGB_{IN}$. It is noted that any branch carrying PGB may include multiple state retention buffers similar to buffer 222 to ensure the signal integrity of the PGB signal across the IC 100. During normal operation, $PGB_{IN}$ is de-asserted high turning N1 on and turning P1 off pulling node 402 low, so that P2 is turned on and N2 is turned off pulling $PGB_{OUT}$ high. During the low power state when VDDG is not provided and $PGB_{IN}$ is asserted low, P1 is turned on and N1 is turned off pulling intermediate node 402 high to VDDC (which remains active during the low power state). Node 402 pulled high turns N2 on so that $PGB_{OUT}$ is asserted low. Node 402 pulled high also ensures that P2 remains off. In this manner, the asserted state of the PGB signal is propagated on the IC 100 during the low power state.

Figure 5:
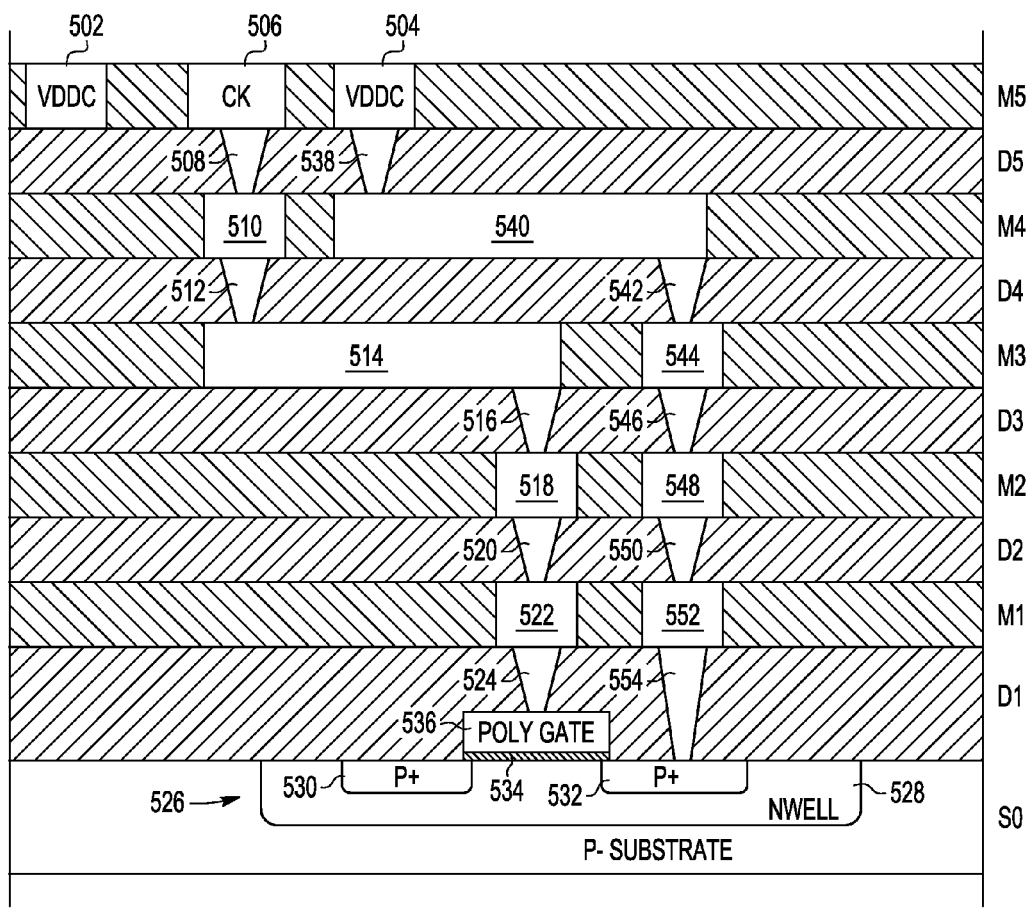
FIG. 5 is a simplified figurative side view of a wafer representing a physical structure of an exemplary embodiment of the integrated circuit of FIG. 1 illustrating an electrical connection between the clock network shielding and a terminal of a state retention device according to one embodiment.

FIG. 5 is a simplified figurative side view of a wafer 500 representing a physical structure of an exemplary embodiment of the IC 100 illustrating an electrical connection between the clock network shielding 210 and a terminal of a state retention device 526 according to one embodiment. The wafer includes a substrate layer S0, five metal layers M1, M2, M3, M4 and M5, and five dielectric layers D1, D2, D3, D4 and D5 separating the metal layers from each other and the substrate layer S0. The state retention device 526 is formed within the substrate layer S0. In the illustrated embodiment, the substrate layer S0 is formed by a P-substrate and the state retention device 526 is illustrated as a transistor formed in the P-substrate. In particular, an NWELL 528 is formed within the P-substrate and two P+ junctions 530 and 532 are formed within the NWELL 528. An insulator layer 534 is formed between the P+ junctions 530 and 532 and a gate 536 (poly gate) is formed on the insulator layer 534 within the dielectric layer D1.

Conductive traces 502 and 504 carrying the state retention voltage VDDC form part of the clock network shielding 210 routed on either side of another conductive trace 506 carrying the clock signal CK within the metal layer M5. Conductive traces 510, 514, 518, and 522 within the metal layers M4, M3, M2 and M1, respectively, are electrically interconnected or coupled together by interlayer connections or vias 508, 512, 516, and 520, respectively, formed within the dielectric layers D5, D4, D3, and D2, respectively. Another conductive via 524 formed within the dielectric layer D1 electrically connects conductive trace 522 to the gate 536 of the device 526. In this manner, CK is electrically coupled to the gate terminal of the device 526.

The clock network shielding 210 normally remains only within the metal layers of an integrated circuit and is typically not routed to the substrate. As shown in FIG. 5, conductive traces 540, 544, 548 and 552 within the metal layers M4, M3, M2 and M1, respectively, are electrically interconnected or coupled together by interlayer connections or vias 538, 542, 546, and 550, respectively, formed within the dielectric layers D5, D4, D3, and D2, respectively. Another via 554 formed within the dielectric layer D1 electrically connects conductive trace 552 to the P+ junction 532 of the device 526. The P+ junction 532 may represent either one of the source or drain of the device 526 depending upon the particular implementation. In this manner, VDDC is electrically coupled to an input terminal of the state retention device 526 of the IC 100. The state retention device 526 represents any transistor of a state retention gate or inverter, such as any one of the NAND gate 308 or the inverters 310, 328 or 330. The state retention device 526 also represents any transistor of a state retention buffer 222, such as transistor P1 shown in FIG. 4.

In summary, a state retention supply voltage is generated on-chip or sourced off chip and coupled to the clock network shielding of the chip. The power inputs of the state retention devices of the chip are coupled to the clock network shielding to be powered by the state retention voltage. A power gating signal is distributed throughout the chip to switch between normal and low power states. State retention buffers with power inputs coupled to the clock network shielding and thus powered by the state retention voltage may be used to buffer the power gating signal.

An integrated circuit having a low power state according to one embodiment includes a state retention node, a conductive clock network shielding and multiple state retention devices for maintaining a state of the integrated circuit during the low power state. The state retention node receives a state retention supply voltage which remains at an operative voltage level relative to a reference voltage level during the low power state. The conductive clock network shielding is distributed with clock signal conductors and is coupled to the state retention node. Each state retention device has a supply voltage input coupled to the clock network shielding so that it remains powered by the state retention supply voltage during the low power state.

The state retention node may be implemented as a minimal set of conductive traces sufficient to maintain the clock network shielding at the operative voltage level within a predetermined voltage tolerance during the low power state. One or more state retention buffers may be provided for buffering a power gating signal indicative of the low power state. Each state retention buffer has a supply voltage input coupled to the clock network shielding. The multiple state retention devices may include a state retention power gating flop or a master/slave latch including at least one state retention gate. A state retention device may be formed on a substrate of the integrate circuit, in which a conductive connection is provided between an interconnect or metal layer and the substrate to electrically couple the clock network shielding to the state retention device. The state retention supply voltage may be generated on-chip, such as derived from a primary power input pin, or may be provided by an off-chip source.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit having a low power state, comprising:
   a state retention node receiving a state retention supply voltage which remains at an operative voltage level relative to a reference voltage level during the low power state;
   a conductive clock network shielding distributed with clock signal conductors, wherein said clock network shielding is coupled to said state retention node; and a plurality of state retention devices each having a supply voltage input coupled to said clock network shielding, wherein said plurality of state retention devices remain powered by said state retention supply voltage to maintain a state of the integrated circuit during the low power state wherein said state that is maintained is a last state of the integrated circuit prior to the low power state.

2. The integrated circuit of claim 1, wherein said state retention node comprises a conductive trace providing said state retention voltage to said clock network shielding.

3. The integrated circuit of claim 1, wherein said state retention node comprises a minimal number of conductive traces sufficient to maintain said clock network shielding at said operative voltage level within a predetermined voltage tolerance during the low power state.

4. The integrated circuit of claim 1, wherein the integrated circuit includes an interconnect layer, and wherein said clock network shielding comprises a conductive trace routed adjacent to a clock signal trace along the interconnect layer.

5. The integrated circuit of claim 4, wherein the integrated circuit includes a substrate, further comprising:
one of said plurality of state retention devices formed on the substrate; and
a conductive connection provided between the interconnect layer and the substrate to electrically couple said clock network shielding to said one of said plurality of state retention devices.

6. The integrated circuit of claim 1, further comprising at least one buffer which buffers a power gating signal indicative of the low power state, wherein each of said at least one buffer includes a supply voltage input coupled to said clock network shielding.

7. The integrated circuit of claim 1, wherein at least one of said plurality of state retention devices comprises a master/slave latch including at least one state retention gate.

8. The integrated circuit of claim 1, further comprising a pin for receiving said state retention supply voltage from an external source, wherein said pin is coupled to said state retention node.

9. The integrated circuit of claim 1, further comprising a power control circuit having an output providing said state retention supply voltage to said state retention node.

10. The integrated circuit of claim 1, further comprising:
a power control circuit having a first output providing a gated supply voltage and having a second output power gating signal indicative of the low power state; and
wherein said power control circuit is operative to assert said power gating signal to initiate the low power state and then to reduce voltage of said gated supply voltage, and is operative to reestablish voltage of said gated supply voltage and then to de-assert said power gating signal to return to a normal operating state.

11. A method of providing state retention on an integrated circuit having a low power state, comprising:
receiving a state retention voltage;
providing the state retention voltage via clock network shielding to a plurality of state retention devices; and
wherein said plurality of state retention devices remain powered by the state retention voltage to maintain a state of the integrated circuit during the low power state, wherein the maintained state is a last state of the integrated circuit prior to the low power state.

12. The method of claim 11, wherein said providing the state retention voltage comprises providing the state retention voltage on a minimum set of conductive traces with sufficient current capacity to maintain the clock network shielding at an operative voltage level within a predetermined voltage tolerance during the low power state.

13. The method of claim 11, further comprising providing the state retention voltage via the clock network shielding to a supply voltage input of a buffer which buffers a power gating signal indicative of the low power state.

14. The method of claim 11, further comprising asserting a power gating signal to initiate the low power state.

15. The method of claim 11, wherein said providing the state retention voltage via clock network shielding to a plurality of state retention devices includes providing the state retention voltage from a conductive trace on an interconnect layer to a state retention device formed on a substrate of the integrated circuit via a conductive connection.

16. The method of claim 11, wherein said providing the state retention voltage via clock network shielding to a plurality of state retention devices comprises providing the state retention voltage to at least one state retention power gating flop.

17. The method of claim 11, wherein said providing the state retention voltage via clock network shielding to a plurality of state retention devices comprises providing the state retention voltage to at least one master/slave latch including at least one state retention gate.

18. The method of claim 11, wherein said receiving a state retention voltage comprises receiving the state retention voltage from an external source.

19. The method of claim 11, further comprising receiving an external source voltage and converting the received external source voltage to the state retention voltage.

20. The method of claim 11, further comprising:
receiving an external source voltage;
converting the external source voltage to a gated supply voltage;
providing a power gating signal indicative of the low power state;
initiating the low power state by asserting the power gating signal and then reducing voltage of the gated supply voltage; and
returning to a normal operating state from the low power state by reestablishing voltage of the gated supply voltage and then de-asserting the power gating signal.

* * * * *